United States Patent [19]
Krummel et al.

[11] Patent Number: 5,308,650
[45] Date of Patent: May 3, 1994

[54] PROCESS AND APPARATUS FOR THE IGNITION OF CVD PLASMAS

[75] Inventors: Harald Krummel, Mainz; Ewald Mörsen, Ingelheim; Volker Paquet, Mainz-Finthen; Helge Vogt; Günther Weidmann, both of Armsheim, all of Fed. Rep. of Germany

[73] Assignee: Schott Glaswerke, Mainz, Fed. Rep. of Germany

[21] Appl. No.: 909,366

[22] Filed: Jul. 6, 1992

[30] Foreign Application Priority Data

Jul. 6, 1991 [DE] Fed. Rep. of Germany ....... 4122452

[51] Int. Cl.$^5$ ............................................. C23C 14/24
[52] U.S. Cl. .................................. 427/570; 427/575; 427/585; 427/248.1; 427/255.3
[58] Field of Search ............ 427/570, 575, 585, 248.1, 427/569, 255.3

[56] References Cited

U.S. PATENT DOCUMENTS

| | | | |
|---|---|---|---|
| 4,877,642 | 10/1989 | Gärtner et al. | 427/575 |
| 4,898,748 | 2/1990 | Kruger | 427/577 |
| 5,053,244 | 10/1991 | Kieser et al. | 427/571 |
| 5,078,848 | 1/1992 | Anttila et al. | 427/569 |
| 5,198,263 | 3/1993 | Stafford et al. | 427/570 |

FOREIGN PATENT DOCUMENTS 3322341 1/1985 Fed. Rep. of Germany .

OTHER PUBLICATIONS

Hünlich et al., J. Opt. Commun. 8(1987) 4, 122-129 (no mo.).

*Primary Examiner*—Janyce Bell
*Attorney, Agent, or Firm*—Millen, White, Zelano & Branigan

[57] ABSTRACT

A process and an apparatus for economically igniting microwave plasmas wherein no undesirable reaction products in the reaction chamber impair the quality of cladding produced thereby. The plasma is ignited on the gas outlet side of the reaction chamber by means of a high voltage that is applied at least for a short period of time. High-frequency pulses or low-frequency high voltages with frequencies in the range from 10 to 100 kHz are utilized. The high voltage is synchronized with the microwave pulses. According to a further process, the microwave pulses are excessively increased for a short time at least at their beginning. Also periodic excessive increases of the microwave pulses are possible A switchable high-voltage source is connected by way of a delay member and a current supply unit to the microwave device The output of the switchable high-voltage source is applied to the gas discharge line of the reaction chamber.

14 Claims, 4 Drawing Sheets

PROCESS AND APPARATUS FOR THE IGNITION OF CVD PLASMAS

BACKGROUND OF THE INVENTION

1) Field of the Invention

The invention relates to a process for the ignition of CVD plasmas in a reaction chamber for the cladding of substrates wherein a reaction gas is passed through the reaction chamber wherein the plasma, after ignition, is stimulated by means of microwave pulses and is maintained for a predetermined time span. The invention also concerns an apparatus for performing the process.

2) Background Art

For the cladding of substrates, particularly glass substrates, the latter are exposed to a plasma in a cladding chamber. Depending on the type of coating desired, appropriate reaction gases are employed which, however, differ with respect to their ignition tendency. Ignition tendency is understood to mean a low ignition voltage of the gas and/or a low extinction voltage. Microwave plasmas, in particular, exhibit the property of being difficult to ignite, especially if the plasma contains a gas acting as an electron captor. Particularly significant ignition troubles occur with gases for pulse-shaped plasmas since the plasma must be reignited after each pulse interval. Such plasmas are described, as PICVD plasmas, for example, in J. OPT. COMM. 8/1987, pages 122, et seq.

U.S. Pat. No. 4,888,088 discloses a process for the ignition of a microwave down-stream plasma wherein the reaction gases are stimulated in a chamber upstream of the reaction chamber. The ignition of this plasma takes place at the end of the reaction chamber on the gas inlet side by coupling in 1 MHz of high voltage.

The use of high frequency represents an expensive solution because the initial investment outlay for the high-frequency components generally rises with the frequency which they are intended to handle.

The placement of the ignition electrode on the gas inlet side according to U.S. Pat. No. 4,888,088 is not damaging for the application disclosed but can be disadvantageous in other microwave cladding methods, such as, for example, the PICVD method, inasmuch as the reaction gases are combined and intermixed even upstream of the substrate. Ignition of the reaction gases in the zone upstream of the reaction chamber then leads to reaction of the gases with one another; this, in turn, has the consequence that a portion of the reaction gases will be deposited already upstream of the reaction chamber. Besides, undefined reaction products, such as dust, for example, are formed, causing dullness of the layer applied to the substrate. The layers formed on the vessel walls by the partial deposition of the reaction gases on account of the ignition procedure are generally of poor adherence and peel off easily; as particles, they additionally impair the quality of the layers produced on the substrate.

A further drawback resides in that an accurate maintenance of the layer thickness is no longer possible, in spite of predetermination of the mass flow of the reaction gases, since an undetermined proportion of the reaction gases is consumed in the zone of the ignition electrode during ignition.

A process and an apparatus for the surface treatment of workpieces by corona discharge has been known from DOS 3,322,341. In order to avoid ground discharges and thus damage to the workpiece, on the one hand, and to prevent reoccurrence of ignition problems, on the other hand, the voltage pulses exhibit in each case in the initial zone a pulse peak for igniting the corona discharge and subsequently pass over into a region with an amplitude suitable for maintaining the corona discharge. This method, making it possible to carry out cladding, hardening, annealing, and the like, differs from processes working with microwave plasmas in that the workpiece is connected as the cathode and the wall of a vacuum vessel surrounding the workpiece is connected as the anode to a voltage source of several 100 to 1,000 volt. However, this conventional process cannot be utilized for the cladding of glass substrates, for example.

SUMMARY OF THE INVENTION

Therefore, the invention relates to a process and an apparatus for the ignition of microwave plasmas, specifically for pulsed microwave plasmas, which are economical and wherein no undesirable reaction products in the reaction chamber impair the quality of the cladding.

It has been found, surprisingly, that the plasma in the reaction chamber can be safely ignited from the gas outlet side of the reaction chamber, although the reaction gas and the stimulated entities are not moved in the direction of the cladding chamber, but rather into the opposite direction toward the vacuum pump. At the same time, the advantage is obtained that the reaction products formed during ignition do not pass into the cladding chamber but rather are removed by the pump.

It has furthermore been found surprisingly that, contrary to the recommendation in U.S. Pat. No. 4,888,088, the frequency of the ignition device need not amount to at least 1 MHz but that, rather, a safe ignition of the microwave plasma is possible at considerably lower frequencies. A high voltage with a frequency of 10 to 100 kHz is entirely adequate for a secure ignition of the microwave plasma.

Since, in the PICVD process, the duration of the microwave pulses is of decisive importance for the thickness and quality of the cladding, care should be taken, when using a low-frequency high voltage, i.e., preferably at a frequency of <30 kHz, that this low-frequency high voltage is synchronized with the microwave pulses, the uncorrelated ignition relatively to the use of the microwave pulses would have the effect, when using a frequency, the period of which is not very much smaller than the duration of the plasma pulse, that the duration of the pulses and thus, in certain circumstances, the quality of the layer deposited per pulse fluctuates statistically. Synchronization of the low-frequency high voltage and thus the formation of a fixed phase relationship between the low-frequency high voltage and the microwave pulses ensures that the ignition of the plasma occurs, with respect to the microwave pulses, always at the same point in time.

Advantageously, the low-frequency high voltage is switched so that it commences simultaneously with the microwave pulses. For this purpose, the ignition voltage as well as the microwave generator are pulsed. Cutting off the ignition in the pulse intervals here offers the advantage that the coverage of the gas discharge as well as the electrodes with an undesired coating is markedly reduced.

It is of advantage, especially for the ignition of poorly ignitable gases, or of gases tending toward very rapid extinction, to maintain the low-frequency high voltage during the entire time span of the microwave pulses. For in this case the plasma is continuously reignited in correspondence with the frequency of the ignition device during the microwave cladding pulse. Extinction of the plasma during the entire microwave pulse can thus be safely prevented.

When using a low-frequency high voltage with frequencies of >30 kHz, the high voltage need not be synchronized with the microwave pulses and can remain turned on during the entire cladding period.

In accordance with another embodiment, suitable in particular for readily ignitable gases, the plasma is ignited by at least one high-voltage pulse per microwave pulse, likewise advantageously synchronized with the microwave pulse. In the case of easily ignitable gases, it is sufficient to use a single, short thyristor pulse per microwave cladding pulse for the ignition of the gas. High-voltage pulses, the pulse length of which lies preferably in the $\mu$sec region, are utilized for igniting the reaction gases.

The high-voltage pulse can commence simultaneously with the microwave pulse. However, the microwave pulse can also be applied with a time delay with respect to the high-voltage pulse, although in this case care must be taken that the time delay $\tau$ is still within a time span within which the plasma will not be extinguished after ignition. It can also be practical for some applications to have the microwave pulse commence before the high-voltage pulse. The position of the high-voltage pulse relatively to the microwave pulse is per se uncritical, if it is made certain that the time period of the microwave pulse after ignition suffices of ra perfect cladding. The selected length of the delay period $\tau$, which can also be negative, depends on the gas pressure and on the type of gas. Also the distance of the site where the high voltage is applied from the reaction chamber depends on the gas pressure and the type of gas. It has been found that the gas can still be safely ignited up to a distance of 50 cm removed from the reaction chamber.

Voltages in the range from 5 to 30 kV are advantageously employed for the low-frequency high voltage as well as for the voltage pulses.

The apparatus for performing the process comprises a reaction chamber with a gas feed line, a gas discharge line for the reaction gas, and a microwave device, connected to a current supply unit and to a clock generator for the production of microwave pulses. Additionally, the output of a switchable high-voltage source is connected to the gas discharge for the ignition of the plasma. In order to transmit the igniting high voltage into the gas chamber, the output of the ignition device, lying at high voltage, is extended by way of a cable, mounted to a dielectric wall of the gas discharge or insulated in case of a metallic wall, via a high-voltage through bore into the exhaust gas stream.

The switchable high-voltage source is connected to the clock generator so that synchronization of the high-voltage pulses or the low-frequency high voltage with the microwave pulses is ensure. The switchable high-voltage source is designed, in dependence on the type of ignition desired, either for the transmission of high-voltage pulses or for the transmission of a low-frequency high voltage.

In case the microwave pulse is to be applied with a time delay with respect to the ignition high voltage, an adjustable delay member is connected in front of the switchable current supply unit for the microwave device. In case the high-voltage pulse is to be applied with a time delay with respect to the microwave pulse, the delay member is accordingly connected in front of the high-voltage source.

In case the microwave pulse is to be applied with a time delay with respect to the ignition high voltage, an adjustable delay member is connected in front of the switchable current supply unit for the microwave device. In case the high-voltage pulse is to be applied with a time delay with respect to the microwave pulse, the delay member is accordingly connected in front of the high-voltage source.

According to another embodiment, a separate ignition device can be entirely dispensed with if the microwave pulse is excessively raised to such an extent that the ignition voltage is exceeded; in this procedure, each microwave pulse is briefly excessively increased periodically, which is of advantage in case of gases having a high extinction voltage. It has been found, in this connection, that the excessively increased microwave pulses ensure a safe ignition of the plasma if such increase is 1.1 to 10 times the pulse amplitude customarily used in the PICVD process for cladding purposes The apparatus for performing the process provides that the current supply unit for the microwave device is designed to be controllable in such a way that, during each pulse supplied by the clock generator, the current transmitted to the microwave device is periodically excessively increased for a short period of time. In order to be able to set the plurality of excessive pulse raises during the period of a microwave pulse, the current supply unit is advantageously fashioned to be programmable. The first excessive pulse elevation is advantageously placed at the beginning of the microwave pulse.

In order to prevent heating up of the substrate, or in order to provide for an only insubstantial heating up of the substrate, by the excessive increase of the microwave pulse, the sum total of the time span $t_{ij}$ of the microwave pulse superelevations is suitably chosen to be smaller than 1/10 the duration $\tau$ of the microwave cladding pulse. With ignition with a single microwave pulse superelevation per microwave cladding pulse, the duration of the excessive pulse increase is preferably limited to 1 $\mu$sec with a microwave cladding pulse of, for example, 1 msec.

BRIEF DESCRIPTION OF THE DRAWINGS

Various other objects, features and attendant advantages of the present invention will be more fully appreciated as the same becomes better understood when considered in conjunction with the accompanying drawing, in which like reference characters designate the same or similar parts throughout the several views, and wherein.

DETAILED DESCRIPTION

Figure 1:
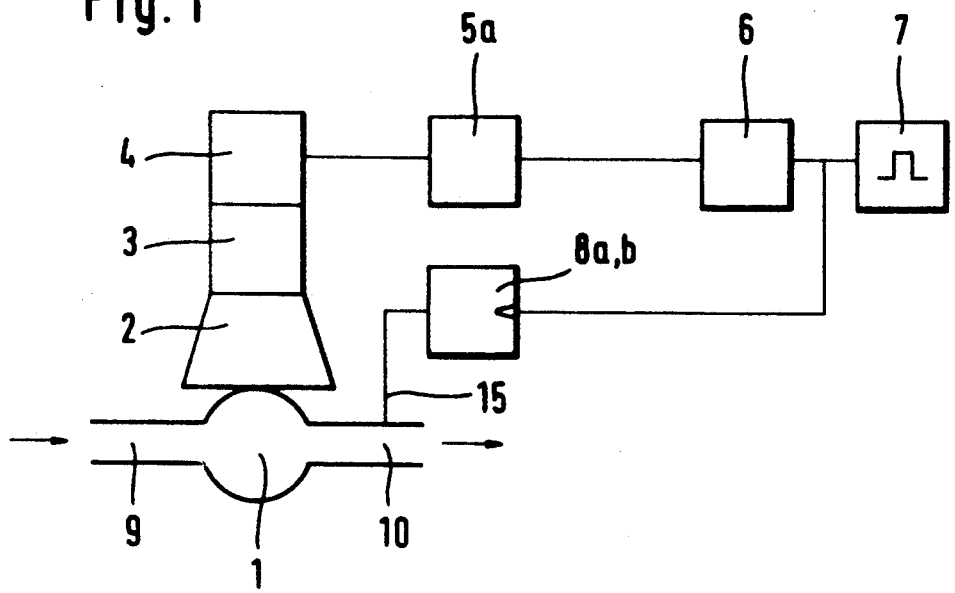
FIG. 1 shows a schematic view of the cladding facility with ignition device.

In FIG. 1, a microwave cladding facility is illustrated, provided with a device for the ignition of the plasma. The substrate to be cladded (not shown) is located in a reaction chamber 1 fed with the reaction gas by way of the gas feed line 9. The exhausted reaction gas is removed via the gas discharge line 10 and a vacuum pump (not illustrated) connected thereto. Above the reaction chamber 1, the microwave device is disposed containing an antenna 2, a tuning unit 3, a microwave source 4. The microwave source is connected to a current supply 5a which latter is connected to a lock generator 7 with the interposition of a delay member 6.

Furthermore, a switchable high-voltage source 8a and 8b is connected to the output of the clock generator 7; the high-voltage output of this source is connected to the gas discharge 10. In order to transmit the ignition high voltage into the gas chamber, the output of the ignition device 8a, 8b, lying at high voltage, is mounted by way of a cable (high-voltage connection line 15) to a dielectric wall of the gas discharge 10, or, in case of a metallic wall, is extended in insulated fashion via a high-voltage through bore into the exhaust gas stream. Two different embodiments of the switchable high-voltage source 8a, 8b are illustrated in greater detail in FIG. 2 and in FIG. 4.

Figure 2:
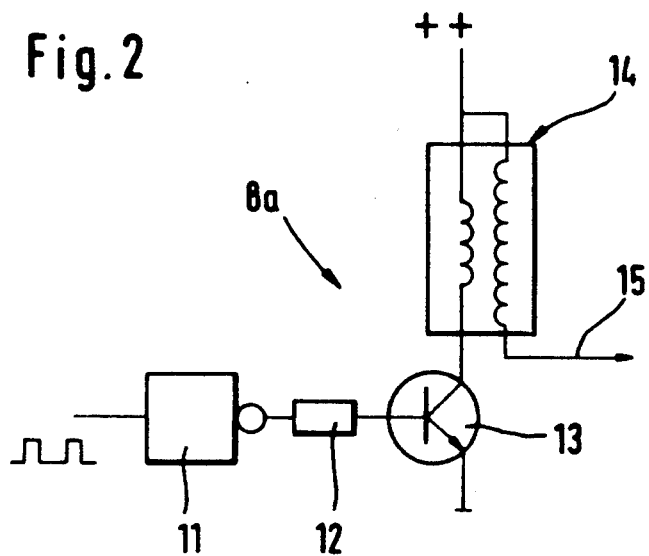
FIG. 2 is a circuit diagram of the switchable high-voltage source.

FIG. 2 shows a switchable high-voltage source 8a, by means of which individual high-voltage pulses are generated. The clock signal arriving from the clock generator 7 passes through an inverter 11 and is then applied by way of a resistor 12 to a switching transistor 13, a high-voltage transformer 14 being connected to the collector of this transistor. The connection between the secondary coil of the high-voltage transformer 14 and the gas discharge 10 is established by the connecting cable 15.

Figure 3:
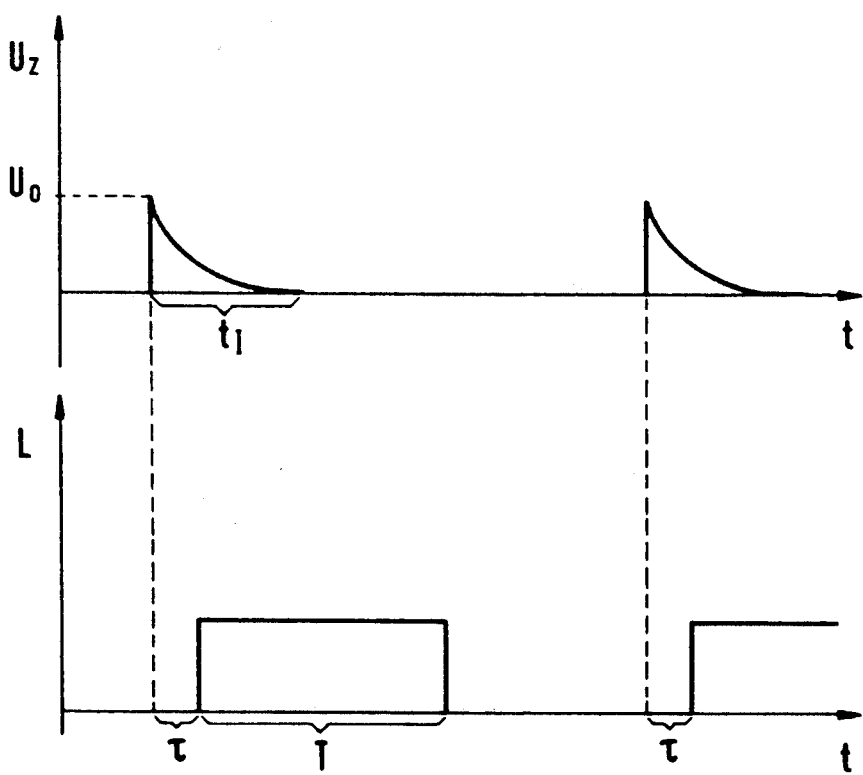
FIG. 3 shows two pulse-time diagrams.

The switchable high-voltage source 8a yields at the output, high-voltage pulses illustrated schematically in FIG. 3. In the top diagram, the high voltage $U_z$ is plotted in dependence on the time t. and in the bottom diagram, the microwave power L is plotted in dependence on the time t. The amplitude $U_o$ of the high-voltage pulses lies at about 5 to 30 kV. The high-voltage pulses have an approximately sawtooth configuration and exhibit a pulse length $t_f$ of, for example, 1 μsec.

Since the output of the clock generator 7 supplies the same pulses to the current supply 5a for the microwave source 4, the microwave pulses are also generated at the same instant as the high-voltage pulses. If a time delay is desired between high-voltage pulses and the microwave pulses, the desired time span is set at the delay member 6. The delay period $\tau$ is selected in FIG. 3 so that the beginning of the microwave pulse is still within the high-voltage pulse.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and unless otherwise indicated. all parts and percentages are by weight.

The entire disclosures of all applications, patents and publications, cited above and below, and of corresponding application German P 41 452.3, filed July 6, 1991, are hereby incorporated by reference.

EXAMPLE 1

A reaction gas consisting of one part $TiCl_4$ and four parts $O_2$ is conducted through the reaction chamber 1 and ignited in the gas discharge line 10. The gas pressure amounts to 1 mbar. Ignition is effected with high-voltage pulses of 15 kV. The decay time of the high-voltage pulse is $1/e$=approximately 1 μsec. The time delay between the high-voltage pulse and the microwave pulse is $\tau=0.1$ msec. The time period T of the microwave pulse lies at 1 msec, the interval time between the microwave pulses being 10 msec.

Figure 4:
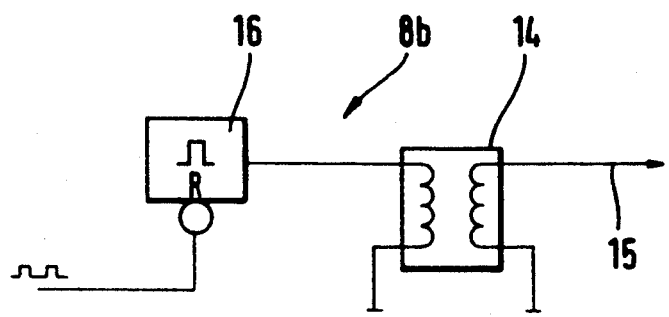
FIG. 4 shows a circuit diagram of a high-voltage source according to a further embodiment.

FIG. 4 shows a further embodiment of the switchable high-voltage source 8b. The pulses supplied by the clock generator 7 first pass to a frequency generator 16 operating in the range from 10 to 100 kHz. The output of the frequency generator 16 is applied—optionally via an additional driver transistor—to the high-voltage transformer 14, the secondary coil of which is connected to the gas discharge 10 via the connecting line 15. As soon as a pulse supplied by the clock generator 7 reaches the frequency generator 16, the low-frequency high voltage is present at the connecting line 15.

Figure 5:
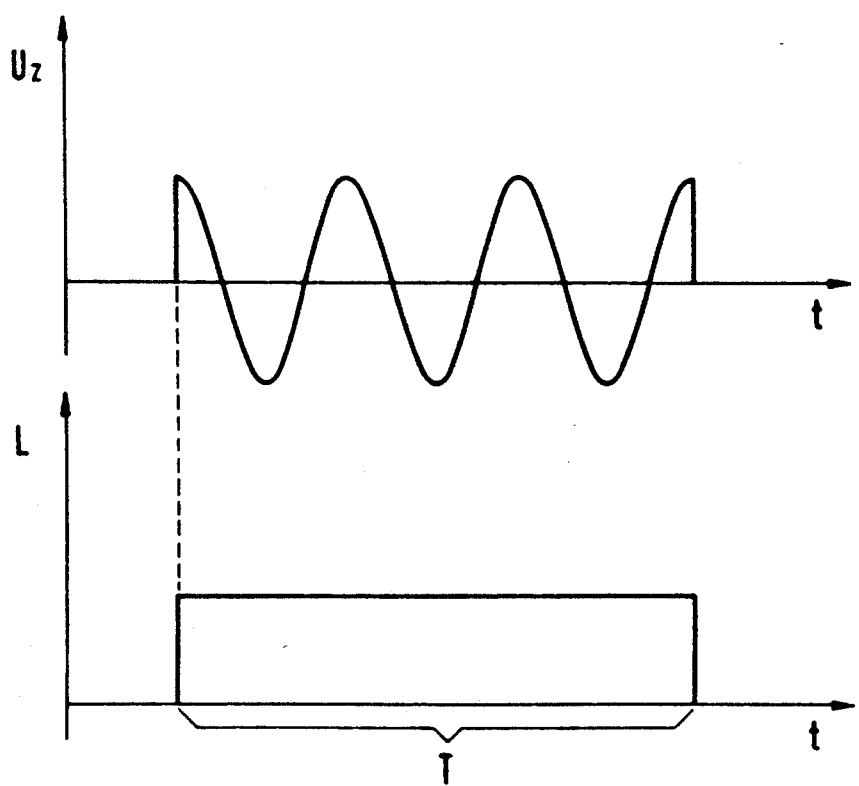
FIG. 5 shows two pulse-time diagrams according to a further embodiment.

FIG. 5 shows, in the top part of the diagram, the low-frequency high voltage $U_z$ in dependence on the time t and, therebelow, a microwave pulse (microwave output L in dependence on the time t). The low-frequency high voltage is synchronized with the microwave pulse preferably in such a way that, at the beginning of the microwave pulse, the low-frequency high voltage is passing through a maximum. The low-frequency high voltage is maintained over the entire time period T of the microwave pulse. The time delay $\tau$ is equal to zero in the illustration shown herein. However, it is also possible to apply the low-frequency high voltage before or after the commencement of the microwave pulse and thus to ignite the gas already prior to or after the beginning of the microwave pulse.

Figure 6:
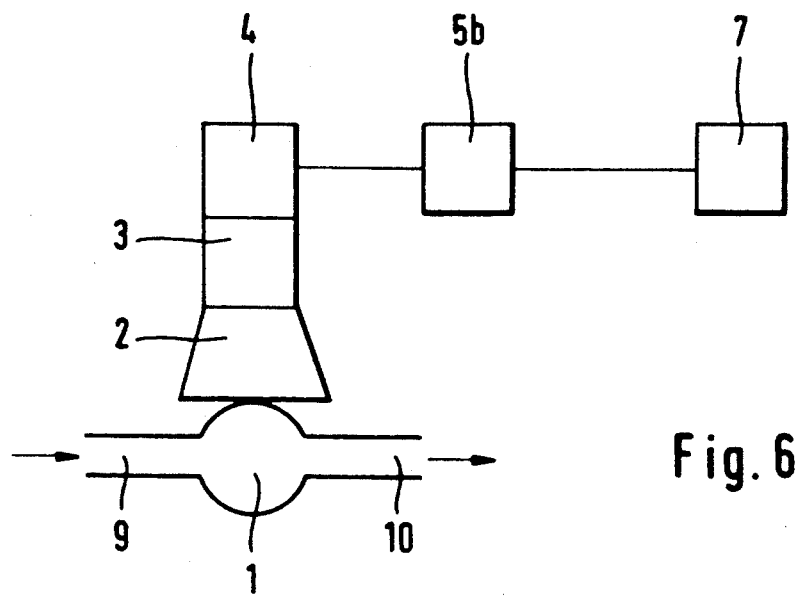
FIG. 6 is a schematic illustration of the cladding facility according to a further embodiment.
Figure 7:
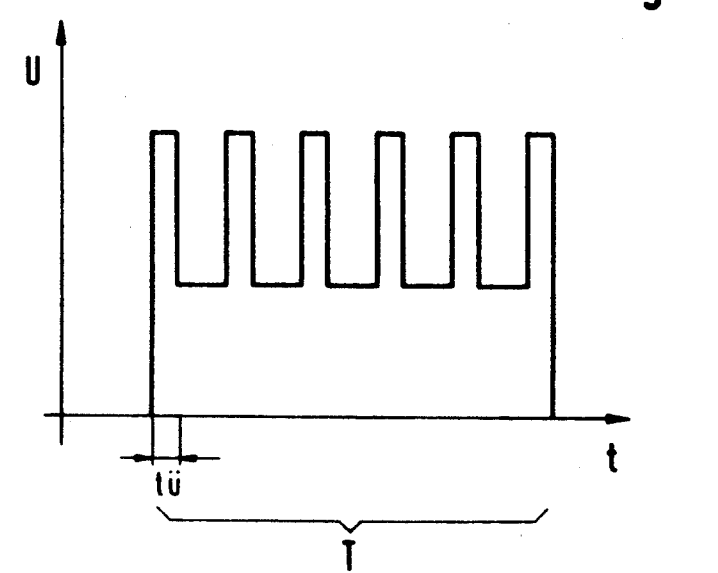
FIG. 7 is a microwave pulse diagram.

Another embodiment is illustrated schematically in FIG. 6. A separate ignition device, engaging at the gas discharge line 10, is dispensed with in the arrangement shown herein since the current supply 5b is designed not only to be switchable by the clock generator but also controllable in its output in addition thereto. The switchable current supply 5b is preferably programmable so that the microwave source is supplied, at least at the beginning of the microwave pulse, with a higher power than is customarily needed for a microwave pulse for the cladding step. Thereby, a limited excessive increase of the pulse over time is produced, utilized for igniting the gas in the reaction chamber 1. In case of poorly ignitable gases, it is also possible to generate a periodic sequence of excessively increased microwave pulses. This is of advantage, in particular, also in case gases are involved having a high extinction voltage (FIG. 7).

EXAMPLE 2

A reaction gas with one part $TiCl_4$ and four parts $O_2$ is passed through the reaction chamber 1. The gas pressure is 1 mbar. The excessive raise of the microwave pulse amounts to double the microwave pulse utilized for the cladding step. The duration of excessive raise in pulse is 1 μsec.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

LIST OF REFERENCE SYMBOLS

1: reaction chamber
2: antenna
3: tuning unit
4: microwave source
5a, b: current supply unit
6: delay member
7: clock generator
8a, b: switchable high-voltage source
9: gas feed line
10: gas discharge line
11: inverter
12: resistor
13: transistor
14: high-voltage transformer
15: high-voltage connection line
16: frequency generator

What is claimed is:

1. A process for the ignition of CVD plasmas in a reaction chamber having gas inlet and gas outlet sides for the cladding of substrates wherein reaction gas is passed through the reaction chamber, the plasma being stimulated therein, after ignition, by means of microwave pulses being maintained for a predetermined time span, wherein the plasma is ignited on the gas outlet side of the reaction chamber by means of a high voltage pulse.

2. The process according to claim 1, wherein a high voltage is employed in the range of 5 to 30 kV.

3. The process according to claim 1, wherein the plasma is ignited by at least one high-voltage pulse per microwave pulse, the high-voltage pulse being synchronized to occur with the generation of microwave pulses.

4. The process according to claim 3, wherein the microwave pulse commences simultaneously or with a time delay with respect to the high-voltage pulse, or prior to the high-voltage pulse.

5. The process according to claim 1, wherein the plasma is ignited by a low-frequency high voltage.

6. The process according to claim 5, wherein the low-frequency high voltage is synchronized to occur with the microwave pulse.

7. The process according to claim 6, wherein the low-frequency high voltage commences with the microwave pulse and is maintained at least for the duration of the microwave pulse.

8. The process according to claim 6, wherein the low-frequency high voltage is cut off in the microwave pulse intervals.

9. The process according to claim 6, wherein a high voltage having a frequency of 1-100 kHz is used.

10. A process for the ignition of CVD plasmas in a reaction chamber for the cladding of substrates wherein a reaction gas is passed through the reaction chamber, the plasma being stimulated therein, after ignition, by means of microwave pulses being maintained for a predetermined time span, wherein the microwave pulses are periodically excessively increased during the duration of each microwave pulse.

11. The process according to claim 10, wherein the microwave pulses are excessively increased by a factor of 1.1 to 10.

12. The process of claim 1, wherein the gas is comprised of one part $TiCl_4$ to four parts $O_2$ and is applied at a pressure of about 1 mbar.

13. The process of claim 12, wherein the amplitude of the high voltage pulse is about 15 kV and the decay time of the high voltage pulse is approximately 1 $\mu$sec with a time delay between the application of the high voltage pulse and the microwave pulse of about $\tau=0.1$ sec, the time period of the microwave pulse being about 1 msec and the time interval between each microwave pulse being about 10 msec.

14. The process of claim 12, wherein the microwave pulses are excessively increased to double the microwave pulse utilized in the cladding step for a duration of about 1 $\mu$sec.

* * * * *